(12) United States Patent
Liao et al.

(10) Patent No.: US 6,732,446 B2
(45) Date of Patent: May 11, 2004

(54) COOLING DEVICE FOR WAFER MACHINE

(75) Inventors: Pao-Kun Liao, Hsin-Chu (TW); Wen-Tsai Su, Miali (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 0 days.

(21) Appl. No.: 10/132,613

(22) Filed: Apr. 25, 2002

(65) Prior Publication Data

US 2003/0200673 A1 Oct. 30, 2003

(51) Int. Cl.$^7$ .............................................. F26B 21/06
(52) U.S. Cl. ...................... 34/75; 34/66; 34/73; 34/218
(58) Field of Search .......................... 34/428, 443, 467, 34/62, 66, 72–75, 107, 202, 218

(56) References Cited

U.S. PATENT DOCUMENTS

| | | | | |
|---|---|---|---|---|
| 4,724,621 A | * | 2/1988 | Hobson et al. ................ 34/218 |
| 5,943,880 A | * | 8/1999 | Tateyama ..................... 62/434 |
| 5,974,682 A | * | 11/1999 | Akimoto ........................ 34/66 |
| 6,073,366 A | * | 6/2000 | Aswad ........................ 34/367 |
| 6,560,896 B2 | * | 5/2003 | Granneman et al. .......... 34/391 |

\* cited by examiner

Primary Examiner—Ira S. Lazarus
Assistant Examiner—Andrea M. Ragonese
(74) Attorney, Agent, or Firm—Tung & Associates

(57) ABSTRACT

A device for rapidly cooling a semiconductor wafer test/transfer machine and which includes a body which is provided with an interior gas passage one end of which is connected to a source of clean, dry air or other gas by a tubing. In typical application, the body is rested on the cover of a semiconductor wafer test or transfer machine, typically above or adjacent to the chuck or other wafer holder of the machine, with the other end of the gas passage in contact with the cover. The air or gas flowing through the gas passage impinges against the machine cover and rapidly cools the chuck or other wafer holder.

16 Claims, 2 Drawing Sheets

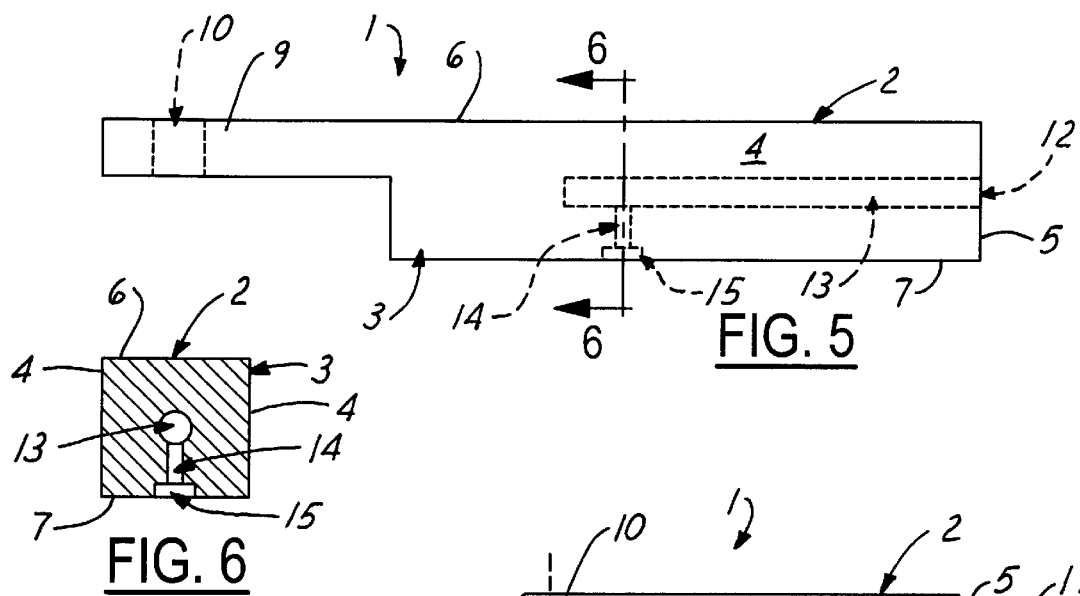
FIG. 5
FIG. 6
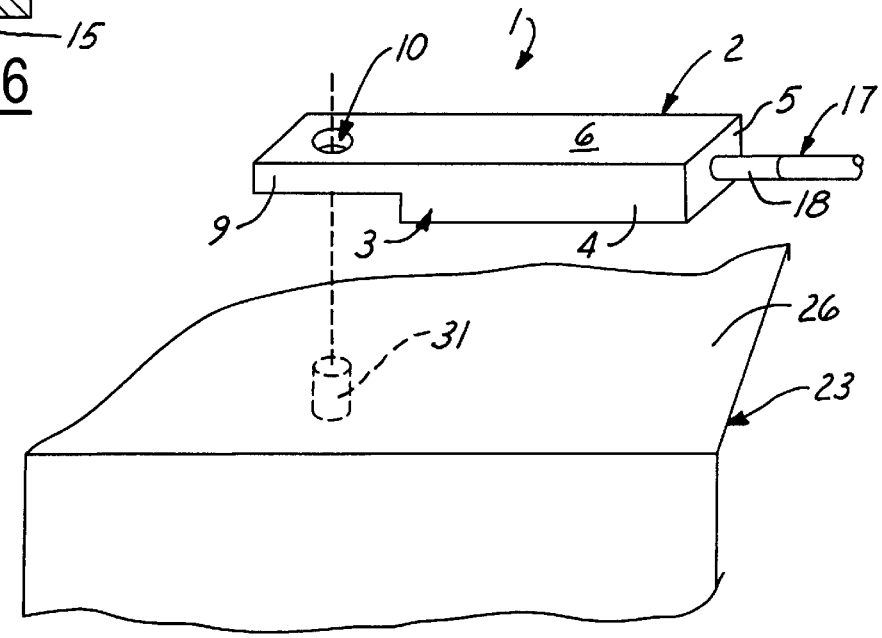
FIG. 7
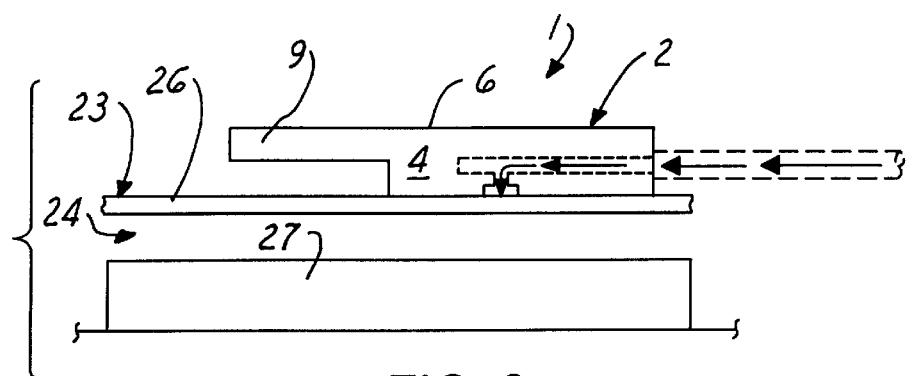
FIG. 8

US 6,732,446 B2

COOLING DEVICE FOR WAFER MACHINE

FIELD OF THE INVENTION

The present invention generally relates to a semiconductor wafer test or transfer machine. More particularly, the invention relates to rapid cooling of a wafer test/transfer machine in the testing and transferring of semiconductor wafers during semiconductor production.

BACKGROUND OF THE INVENTION

A conventional method used by the semiconductor industry in the manufacturing of semiconductor integrated circuits includes the steps of fabrication, wafer sort, assembly and test, respectively. In the fabrication step, as many as several thousand dies (integrated circuits) are formed onto a semiconductor wafer. In the wafer sort step, each of the dies on the wafer is tested to determine its electrical characteristics and operability, and defective dies are distinguished from operable dies. The defective dies are often marked by an ink mark at the wafer sorting step. In the assembly step, the unmarked, operable dies are assembled into a package, and in the test step, the packaged integrated circuits are tested for operability and reliability.

Each of the fabrication, wafer sort, assembly and test steps may be further broken down into smaller steps carried out at multiple stations. These may include one or more measurement stations for receiving wafers and measuring or testing various wafer parameters, as well as packaging and shipping stations. Because excessive human handling and transport of the wafers between stations increases the possibility of contamination and inadvertent damage to the wafers, the wafers are typically transferred from one station to another using a wafer test/transfer machine or wafer prober. The various electrical characteristics of the wafers are also tested on the wafer prober, which holds the wafers at a stationary position where the testing or other process is performed.

In a typical wafer prober, a semiconductor wafer is mounted on the top surface of a wafer chuck inside the prober. A vacuum system is connected to the wafer chuck, and a series of concentric vacuum grooves in the top surface of the chuck conduct the vacuum to the wafer to secure the wafer in place on the chuck. The prober includes a group of electrical probes on a probe card which apply predetermined electrical currents to various predetermined portions of the die on the wafers, and a tester senses the dies' responses to the currents.

The wafer sort and test steps for semiconductor wafers may also include heat-screening of the wafers. Accordingly, the wafer prober is provided with a heater for heating the chuck and the semiconductor wafer held thereon. Before the heat-testing of the semiconductor wafer in the wafer probe, the chuck must be at a relatively cool temperature as the wafer is loaded on the chuck to prevent sudden heating of the wafer and thermal shock damage thereto. Furthermore, the wafer probe may be used to transfer the wafer from one station to another at room temperature. One of the problems realized in the operation and use of conventional wafer probers is that a long period of time is required for the chuck of the wafer prober to cool down to a sufficient temperature to enable safe loading of the semiconductor wafer onto the chuck for subsequent heat-testing of the wafer or for transfer of the wafer between stations at room temperature.

SUMMARY OF THE INVENTION

Therefore, it is an object of the present invention to facilitate rapid cooling of a chuck or other wafer holder on a semiconductor wafer prober or wafer test/transfer machine.

It is another object of the present invention to substantially decrease the time ordinarily required for cooling of a wafer holder in a semiconductor wafer test/transfer machine.

It is yet another object of the present invention to enhance efficiency in the production of semiconductor integrated circuits by increasing the batch volume of semiconductor wafers capable of being tested and transferred over a given period of time in a semiconductor production facility.

It is still another object of the present invention to facilitate rapid cooling of a wafer chuck or other wafer holder in a semiconductor wafer transfer/test machine by utilizing compressed air or other gas to dissipate heat.

It is a further object of the present invention to provide a device which can be held by hand for rapidly cooling a wafer holder in a semiconductor wafer test/transfer machine.

In accordance with these and other objects and advantages, the present invention comprises a body which is provided with an interior gas passage one end of which is connected to a source of clean, dry air or other gas by a tubing. The body is rested on the cover of a semiconductor wafer test or transfer machine, typically above or adjacent to the chuck or other wafer holder of the machine, with the other end of the gas passage in contact with the cover. The clean, dry air or other gas flowing under pressure through the gas passage impinges against the machine cover and rapidly cools the chuck or other wafer holder.

BRIEF DESCRIPTION OF THE DRAWINGS

The present invention will now be described, by way of example, with reference to the accompanying drawings, in which:

FIG. 5 is a side view of the body portion of the wafer machine cooling device, with interior gas passages and an attachment opening shown in phantom;

FIG. 6 is a cross-sectional view, taken along section lines 6—6 in FIG. 5, of the body portion of the wafer machine cooling device;

FIG. 7 illustrates typical removable attachment of the wafer machine cooling device to a wafer test/transfer machine when the wafer machine cooling device is not in use; and FIG. 8 illustrates typical application of the wafer machine cooling device of the present invention.

DESCRIPTION OF THE PREFERRED EMBODIMENTS

Figure 1:
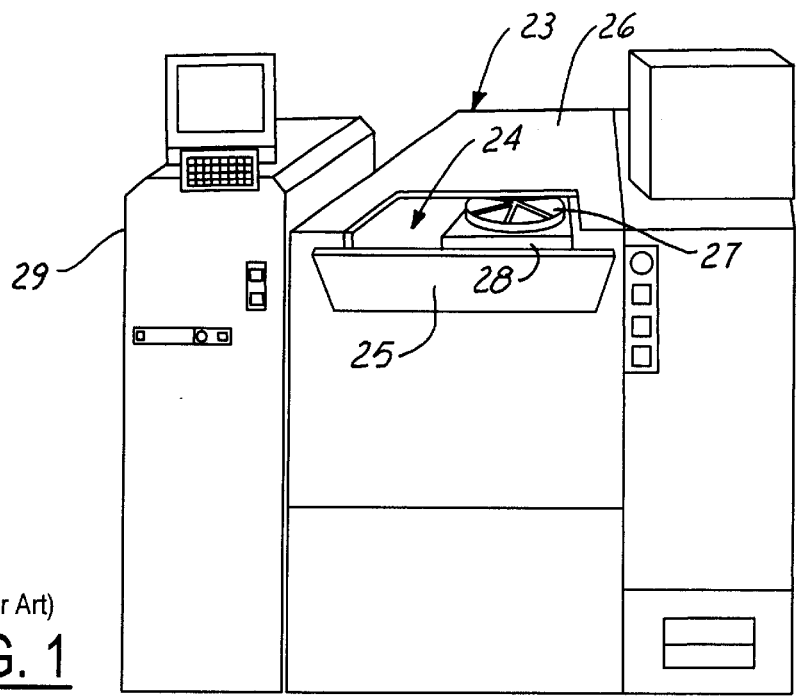
FIG. 1 illustrates a conventional semiconductor wafer test/transfer machine which is suitable for implementation of the present invention.
Figure 2:
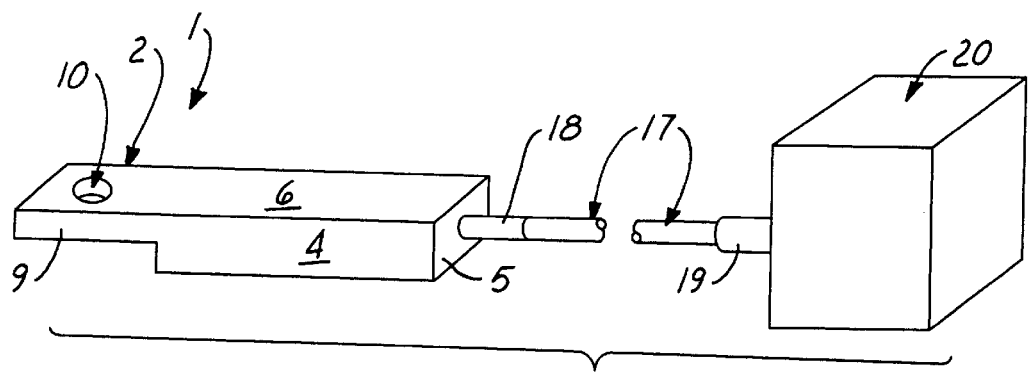
FIG. 2 illustrates one illustrative embodiment of a wafer machine cooling device of the present invention.

When used herein, the term wafer machine or wafer test/transfer machine shall be understood to mean any machine used in the processing, sorting, transfer, testing or storing of semiconductor wafers. When used herein, the term wafer holder shall be understood to mean any device or support for holding or supporting semiconductor wafers in a wafer machine, including but not limited to a wafer chuck. When used herein, the term tubing shall be understood to mean any tube, sleeve or conduit capable of transferring air or gas through a pressure differential. When used herein, the term gas shall be understood to mean air, nitrogen or any gas suitable for cooling purposes by heat dissipation. When used herein, the term gas source shall be understood to mean any apparatus or storage device capable of emitting air or other gas under pressure.

The present invention has particularly beneficial utility in application to cooling semiconductor wafer chucks or other wafer holders in wafer probes or other semiconductor wafer test/transfer machines. However, the invention is not so limited in application and while references may be made to such wafer test/transfer machines, the invention may be more generally applicable to cooling in a variety of industrial and product applications.

Advanced logic integrated circuits are fabricated using in excess of 300 fabrication steps. Following fabrication, the semiconductor wafers containing the circuits are subjected to a series of test and evaluation steps. These include electronic testing the individual dies, or circuits; heat-testing the circuits by subjecting the wafers to a variety of temperatures; and sorting the circuits according to operability by labeling the inoperable circuits with ink.

These wafer processing steps are generally carried out using wafer test/transfer machines or wafer probers, each of which is typically fitted with a rotatable wafer chuck that is movable in X, Y and Z directions and adapted to hold a semiconductor wafer with the use of vacuum suction or other adhering mechanism. In the electrical testing of the semiconductor wafer, a probe card incorporated in the wafer prober has a probe, or thin wirelike structure, which contacts each electrode pad of the chip responsive to movement of the chuck in the Z direction. In the heat testing of semiconductor wafers, the interior of the wafer prober is elevated and lowered to test the integrity of the circuits over a broad temperature range as the wafer adheres to the chuck. Frequently, the wafer probers are used to transfer a wafer or wafers from one processing station to another. Such transfer may require that the wafer on the chuck be heated before processing at the subsequent station, or alternatively, may require that the wafer on the chuck be transferred and delivered to the next station at room temperature.

Because most semiconductor wafer processing facilities have a limited number of wafer probers or test/transfer machines to effect the wafer processing and transferring operations, two or more of these operations may require the use of one machine. The number of wafers which can be processed or transferred using one machine when a variety of processing or transfer temperatures are utilized is thus limited by the length of time required for each machine to cool from a high processing temperature for one application to a lower temperature for the next application. For example, cooling of a wafer prober or test/transfer machine from about 85° C. to about 30° C. generally requires a time period of about 90 minutes, or 1.5 hours.

According to the present invention, rapid cooling of a semiconductor wafer holder in a wafer test/transfer machine is exemplified in FIG. 8. While the invention as described has particular utility in rapidly cooling a wafer chuck or other wafer holder in a wafer probe or other wafer test/transfer machine, it will be appreciated by those skilled in the art that the invention may be equally applicable to cooling of machinery in other industrial applications. A typical semiconductor wafer test/transfer machine, such as a wafer probe, is generally indicated by reference numeral 23 in FIG. 1 and includes a cover 26 which encloses an interior 24. A wafer holder or chuck 27 is rotatably mounted on a support 28 inside the interior 24, and a door 25 may be hingedly attached to the wafer test/transfer machine 23 for selectively opening and closing the interior 24. The wafer machine 23 typically further includes a control system 29 for controlling the various operating parameters of the wafer machine 23.

During processing, testing or transfer of semiconductor wafers in a semiconductor wafer production facility, a semiconductor wafer (not illustrated) is mounted on the chuck 27, typically by vacuum pressure or some other adhering mechanism, and may be rotated with the chuck 27 to align the integrated circuits on the wafer with various probes (not illustrated) for contact with and electrical testing of the circuits. During subsequent sorting of the operable and non-operable circuits on the wafer, the chuck 27 is moved to the appropriate location inside the interior 24 to facilitate labeling the non-operable circuits typically using ink.

Before the wafer machine 23 is used to transfer a wafer from one processing or testing station to another processing or testing station in the facility, the chuck 27 may require heating by means of a conventional heating system contained inside the wafer machine 23. In that case, the chuck 27 must be cooled to room temperature before loading of the wafer on the chuck 27 in order to prevent thermal shock-induced damage to the wafer. After the wafer is loaded on the chuck 27, the temperature of the chuck 27 is gradually increased to heat the wafer. On the other hand, the chuck 27 may be used to maintain the wafers at room temperature during the transfer. Under circumstances in which the wafer machine 23 is initially used to transfer a semiconductor wafer at an elevated temperature and transfer of a subsequent wafer requires a significantly lower temperature, such as room temperature, a lag time of about 1.5 hours may be required for cooling the wafer machine 23 by convection with ambient air before loading of the next wafer onto the chuck 27 can be commenced. Rapid cooling of the chuck 27 is therefore required for transfer of a larger volume of semiconductor wafers per unit time and thus, more economical and efficient production of the integrated circuits.

An illustrative embodiment of the wafer machine cooling device of the present invention is generally indicated by reference numeral 1 in FIGS. 2–6 of the drawings. The wafer machine cooling device 1 includes a body 2, having a main body portion 3 typically with an attachment flange 9 extending from the main body portion 3 and fitted with an attachment opening 10 for purposes hereinafter described. The main body portion 3 of the body 2 typically has a generally rectangular cross-sectional configuration, as illustrated in FIG. 6, and includes side surfaces 4, a rear surface 5, a top surface 6 and a bottom surface 7. However, it will be understood that the main body portion 3 may have any alternative cross-sectional configuration suitable for the purpose of the wafer machine cooling device 1.

Figure 3:
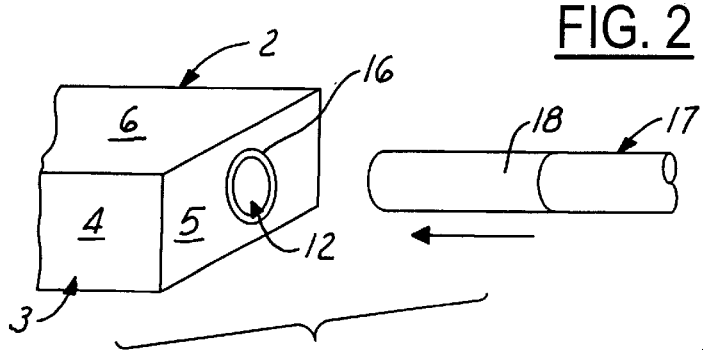
FIG. 3 illustrates removable attachment of an air tubing to the body portion of the wafer machine cooling device by operation of a quick connect/disconnect coupling in one illustrative embodiment of the present invention.
Figure 4:
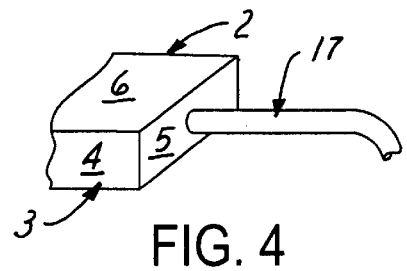
FIG. 4 illustrates fixed attachment of the tubing to the body portion of the wafer machine cooling device in another illustrative embodiment of the present invention.

As illustrated in phantom in FIG. 5, a main gas passage 13 extends longitudinally through a portion of the main body portion 3, and communicates with an gas entry opening 12 provided in the rear surface 5 of the main body portion 3. An exit gas passage 14 extends from the main gas passage 13 and communicates with a typically flared or wider-diameter exit gas opening 15, provided typically in the bottom surface 7 of the main body portion 3. As illustrated in FIG. 3, a coupling receptacle 16 may be provided in the gas entry opening 12 for removably receiving a companion quick connect/disconnect coupling 18 of selected design provided on one end of an elongated pneumatic tubing 17, for purposes hereinafer described. In another embodiment, illustrated in FIG. 4, the quick connect/disconnect coupling 18 is omitted and the pneumatic tubing 17 is fixedly mounted in the gas entry opening 12. The opposite end of the pneumatic tubing 17 may terminate in a tubing plug 19 which is sealingly inserted in a companion plug socket (not illustrated) provided in an air or other gas source 20.

In typical application of the wafer machine cooling device 1, the chuck support 28 and chuck 27 of the wafer machine 23 are initially moved to the portion of the interior 24 where the inking process is applied to nonfunctional or inoperable circuits in the semiconductor wafer. After the quick connect/disconnect coupling 18 of the pneumatic tubing 17 is inserted in the gas entry opening 12 of the body 2 and the tubing plug 19 of the pneumatic tubing 17 is inserted in the appropriate socket (not illustrated) of the gas source 20, the body 2 of the wafer machine cooling device 1 is manually placed and held on the cover 26 of the wafer machine 23, directly above the chuck 27 as illustrated in FIG. 8, with the bottom surface 7 of the body 2 disposed in direct contact with the cover 26. Accordingly, the bottom surface 7 of the body 2 serves as the contact surface for the body 2. The gas source 20 is then operated to deliver typically about 80 psi of clean, dry air, molecular nitrogen or other gas through the pneumatic tubing 17. Consequently, the air or other gas flows through the main gas passage 13 and then through the exit gas passage 14 and out the flared exit gas opening 15 of the main body portion 3, where the air or gas impinges against the cover 26 of the wafer machine 23. As the cover 26 cools due to the flowing air or gas, the temperature drop is transmitted by convection to the chuck 27, through the interior 24 of the wafer machine 23. It has been found that continuous application of the body 2 to the cover 26 is capable of cooling the chuck 27 from a temperature of 85° C. to 30° C. in 5 (five) minutes, as opposed to ninety (90) minutes, or 1.5 hours, which is the time period required for the same temperature change of the chuck 27 using conventional cooling by convection of ambient air.

A typical manner of storing the body 2 in a "stand-by" or stowed position is illustrated in FIG. 7. A peg 31 may be upward-standing either directly from the cover 26 or other surface of the wafer machine 23 or from a rack mounted on the wafer machine 23, in which case the attachment opening 10 in the attachment flange 9 of the body 2 receives the peg 31 as the body 3 is lowered to rest on the cover 26 or other surface. Accordingly, the body 2 is substantially prevented from inadvertently falling from the wafer machine 23 and is conveniently positioned for use on a selected wafer machine 23 in the semiconductor production facility by removing the attachment flange 9 from the peg 31.

It will be understood by those skilled in the art that one wafer machine cooling device 1 may be used to cool any number of wafer machines 23 in the semiconductor wafer production facility in the manner heretofore described, by providing a pneumatic tubing 17 of sufficient length to facilitate reaching the wafer machines 23 or providing a portable air or gas source 20.

While the preferred embodiments of the invention have been described above, it will be recognized and understood that various modifications can be made in the invention and the appended claims are intended to cover all such modifications which may fall within the spirit and scope of the invention.

We claim:

1. Semiconductor fabrication equipment including a cooling device comprising:
    a portable body having a gas entry opening, an exit gas opening and a gas passage connecting said gas entry opening to said exit gas opening;
    a gas source provided in pneumatic communication with said gas entry opening; and
    wherein said portable body is removably attached to the semiconductor fabrication equipment.

2. The semiconductor fabrication equipment of claim 1 wherein said gas passage comprises a main gas passage communicating with said gas entry opening and an exit gas passage connecting said main gas passage to said exit gas opening.

3. The semiconductor fabrication equipment of claim 1 wherein said exit gas opening is wider than said gas passage.

4. The semiconductor fabrication equipment of claim 3 wherein said gas passage comprises a main gas passage communicating with said gas entry opening and an exit gas passage connecting said main gas passage to said exit gas opening.

5. Semiconductor fabrication equipment including a cooling device, comprising:
    a portable body having a gas entry opening, an exit gas opening and a gas passage connecting said gas entry opening to said exit gas opening;
    a gas source provided in pneumatic communication with said gas entry opening; and
    an attachment flange carried by said portable body and an attachment opening extending through said attachment flange for removable attachment of said portable body to the semiconductor fabrication equipment.

6. The semiconductor fabrication equipment of claim 5 wherein said gas passage comprises a main gas passage communicating with said gas entry opening and an exit gas passage connecting said main gas passage to said exit gas opening.

7. The semiconductor fabrication equipment of claim 5 wherein said exit gas opening is wider than said gas passage.

8. The semiconductor fabrication equipment of claim 7 wherein said gas passage comprises a main gas passage communicating with said gas entry opening and an exit gas passage connecting said main gas passage to said exit gas opening.

9. Semiconductor fabrication equipment including a cooling device, said cooling device comprising:

- a portable body having a contact surface for contacting the semiconductor wafer machine, a gas entry opening provided in said body, an exit gas opening provided in said contact surface of said body, and a gas passage connecting said gas entry opening to said exit gas opening;
- a gas source;
- a flexible pneumatic tubing connecting said gas source to said gas entry opening of said body for blowing gas through said gas passage and against the semiconductor wafer machine through said exit gas opening for cooling the semiconductor wafer machine; and
- an attachment element carried by said body for removably engaging the semiconductor wafer machine.

10. The semiconductor fabrication equipment of claim 9 wherein said gas passage comprises a main gas passage communicating with said gas entry opening and an exit gas passage connecting said main gas passage to said exit gas opening.

11. The semiconductor fabrication equipment of claim 9 wherein said exit gas opening is wider than said gas passage.

12. The semiconductor fabrication equipment of claim 11 wherein said gas passage comprises a main gas passage communicating with said gas entry opening and an exit gas passage connecting said main gas passage to said exit gas opening.

13. The semiconductor fabrication equipment of claim 9 wherein said attachment element comprises an attachment flange and an attachment opening extending through said attachment flange for removably receiving a peg on the semiconductor wafer machine.

14. The semiconductor fabrication equipment of claim 13 wherein said gas passage comprises a main gas passage communicating with said gas entry opening and an exit gas passage connecting said main gas passage to said exit gas opening.

15. The semiconductor fabrication equipment of claim 13 wherein said exit gas opening is wider than said gas passage.

16. The semiconductor fabrication equipment of claim 15 wherein said gas passage comprises a main gas passage communicating with said gas entry opening and an exit gas passage connecting said main gas passage to said exit gas opening.

* * * * *